(12) United States Patent
Gao et al.

(10) Patent No.: US 9,660,215 B2
(45) Date of Patent: May 23, 2017

(54) DISPLAY PANEL AND ENCAPSULATION METHOD THEREOF

(71) Applicant: BOE TECHNOLOGY GROUP CO., LTD., Beijing (CN)

(72) Inventors: Xinwei Gao, Beijing (CN); Dan Wang, Beijing (CN); Rui Hong, Beijing (CN); Chao Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/891,915

(22) PCT Filed: Apr. 13, 2015

(86) PCT No.: PCT/CN2015/076422
§ 371 (c)(1),
(2) Date: Nov. 17, 2015

(87) PCT Pub. No.: WO2016/078300
PCT Pub. Date: May 26, 2016

(65) Prior Publication Data
US 2016/0359131 A1    Dec. 8, 2016

(30) Foreign Application Priority Data

Nov. 17, 2014    (CN) .......................... 2014 1 0655619

(51) Int. Cl.
*H01L 51/56* (2006.01)
*H01L 51/52* (2006.01)

(52) U.S. Cl.
CPC ............ *H01L 51/524* (2013.01); *H01L 51/52* (2013.01); *H01L 51/5237* (2013.01); *H01L 51/5246* (2013.01); *H01L 51/56* (2013.01)

(58) Field of Classification Search
CPC ... H01L 51/5246; H01L 51/56; H01L 51/524; H01L 33/52; H01L 27/156
See application file for complete search history.

(56) References Cited

U.S. PATENT DOCUMENTS

| | | | | |
|---|---|---|---|---|
| 5,600,203 A | * | 2/1997 | Namikawa | ............... H01J 9/242 |
| | | | | 313/292 |
| 6,282,760 B1 | * | 9/2001 | Mars | ........................ A44B 9/16 |
| | | | | 24/303 |

(Continued)

FOREIGN PATENT DOCUMENTS

| | | |
|---|---|---|
| CN | 101807667 | 11/2011 |
| CN | 102439753 | 5/2012 |

(Continued)

*Primary Examiner* — Evan Pert
(74) *Attorney, Agent, or Firm* — Harness, Dickey & Pierce, P.L.C.

(57) ABSTRACT

Embodiments of the present invention disclose a display panel and an encapsulation method thereof, and relate to the field of display technology. The display panel comprises a first substrate and a second substrate which are disposed in opposition to each other. The first substrate and the second substrate are encapsulated by a sealant. In a non-display area of the display panel, a first adsorption layer is disposed on one of the first substrate and the second substrate, and a second adsorption layer is disposed on the other of the first substrate and the second substrate. The first adsorption layer and the second adsorption layer may be attracted to each other by magnetic force. Embodiments of the present invention can effectively avoid the separation of the first substrate and the second substrate due to the stress released during the process of melting the sealant, thereby improving the problem of poor encapsulation caused thereby.

16 Claims, 2 Drawing Sheets

(56) References Cited

U.S. PATENT DOCUMENTS

| | | | | |
|---|---|---|---|---|
| 7,597,603 B2* | 10/2009 | Becken | ............ | C03C 27/06 |
| | | | | 445/24 |
| 8,242,688 B2* | 8/2012 | Kwon | ............ | H01L 51/524 |
| | | | | 313/504 |
| 8,450,926 B2* | 5/2013 | Roberts | ............ | H01L 51/5203 |
| | | | | 313/504 |
| 9,010,972 B2* | 4/2015 | Jung | ............ | G09G 3/3208 |
| | | | | 362/184 |
| 9,508,960 B2* | 11/2016 | Su | ............ | H01L 51/56 |
| 2006/0082298 A1* | 4/2006 | Becken | ............ | C03C 27/06 |
| | | | | 313/512 |
| 2007/0128966 A1* | 6/2007 | Becken | ............ | C03C 27/06 |
| | | | | 445/25 |
| 2008/0128683 A1* | 6/2008 | Kim | ............ | H01L 51/5246 |
| | | | | 257/40 |
| 2009/0071588 A1* | 3/2009 | Kimura | ............ | C03C 27/06 |
| | | | | 156/64 |
| 2009/0203283 A1* | 8/2009 | Gentile | ............ | H01L 51/5246 |
| | | | | 445/25 |
| 2011/0114991 A1* | 5/2011 | Lee | ............ | H01L 51/5246 |
| | | | | 257/100 |
| 2011/0140373 A1 | 6/2011 | Lee et al. | | |
| 2011/0248625 A1* | 10/2011 | Kwon | ............ | H01L 51/524 |
| | | | | 313/504 |
| 2012/0050972 A1* | 3/2012 | Ho | ............ | G06F 3/0202 |
| | | | | 361/679.4 |
| 2012/0257397 A1* | 10/2012 | Lee | ............ | F21V 15/01 |
| | | | | 362/374 |
| 2013/0300284 A1* | 11/2013 | Nishido | ............ | H01L 51/0097 |
| | | | | 313/511 |
| 2014/0085907 A1* | 3/2014 | Jun | ............ | G09G 3/3208 |
| | | | | 362/362 |
| 2014/0118911 A1* | 5/2014 | Tang | ............ | G02F 1/133308 |
| | | | | 361/679.01 |
| 2014/0322827 A1* | 10/2014 | Su | ............ | H01L 51/56 |
| | | | | 438/3 |
| 2015/0062927 A1* | 3/2015 | Hirakata | ............ | G09F 9/301 |
| | | | | 362/362 |
| 2016/0284942 A1* | 9/2016 | Gao | ............ | H01L 21/67126 |

FOREIGN PATENT DOCUMENTS

| | | | | |
|---|---|---|---|---|
| CN | 103187541 | | 7/2013 | |
| CN | 103258971 | | 8/2013 | |
| CN | 103337511 | | 10/2013 | |
| CN | 103715371 | | 4/2014 | |
| CN | 203910867 | | 10/2014 | |
| CN | 104362103 | | 2/2015 | |
| CN | 104362259 | | 2/2015 | |
| CN | 204155965 | | 2/2015 | |
| CN | 204167262 | | 2/2015 | |
| JP | 2000-82385 | * | 3/2000 | ............ H01J 5/03 |
| KR | 20130102835 | | 9/2013 | |
| WO | 2007/013001 | | 2/2007 | |

* cited by examiner

DISPLAY PANEL AND ENCAPSULATION METHOD THEREOF

TECHNICAL FIELD

Embodiments of the present invention relate to the field of display technology, and in particular, to display panel and encapsulation method thereof.

BACKGROUND

At present, Light Emitting Diode (LED) display panels are mainly encapsulated by using frit. FIG. 1 is a schematic cross-sectional view of an existing LED display panel, in which a first substrate 1 and a second substrate 2 are encapsulated together by a sealant 3 (e.g., frit) interposed therebetween, and a light emitting unit 4 is disposed on the second substrate 2. In the encapsulation process, a laser is used to irradiate the solid sealant 3 to melt it. After the sealant 3 is solidified again, the first substrate 1 and the second substrate 2 can be encapsulated together.

The laser can only irradiate a part of the sealant 3 at a time. When the part of the sealant 3 is melted, stress release phenomenon may happen between the first substrate 1 and the second substrate 2. The released stress tends to separate the two substrates, such that the sealant 3 fails to effectively encapsulate the first substrate 1 and the second substrate 2. Thereby, the problem of poor encapsulation occurs.

With respect to the above problem, one solution in prior art is to dispose a thermally-expansible layer and other interlayers on the outer side of the first substrate 1 (i.e., the side away from the second substrate 2). When the sealant 3 is irradiated by the laser and then melted, the generated heat is transferred to the thermally-expansible layer at the same time. The thermally-expansible layer is heated and then expands, thereby pressing the first substrate 1 against the second substrate 2 to prevent the two substrates from being separated due to the released stress. However, this solution requires the laser to be kept irradiating from the bottom up (i.e., irradiating from the second substrate 2 towards the first substrate 1), and thus is inconvenient for operation. Besides, because the thermally-expansible layer is generally made from organic macromolecule material or elastic rubber material, it tends to cause environmental pollution.

Another solution in prior art is to add a pressure plate assembly on each of the outer sides of the first substrate 1 and the second substrate 2, so as to provide clamping force for the first substrate 1 and the second substrate 2. Besides, a sensor is disposed to sense the magnitude of the pressure between the pressure plate assemblies, such that poor sealing effect due to unduly small clamping force or device damage due to unduly large clamping force can be avoided, thereby improving the encapsulation quality. However, when this solution is used for encapsulation, because the interval between the first substrate 1 and the second substrate 2 is very small (generally below 20 μm), it is difficult for the sensor to effectively sense the magnitude of the pressure between the pressure plate assemblies. Furthermore, it is also difficult to effectively integrate the sensor with the two substrates.

SUMMARY

Embodiments of the present invention provide a display panel and an encapsulation method thereof, so as to improve the problem of poor encapsulation between two substrates of the display panel due to the stress released when a sealant is melted.

As the first aspect of the present invention, there is provided a display panel comprising a first substrate and a second substrate which are disposed in opposition to each other. The first substrate and the second substrate are encapsulated by a sealant. In a non-display area of the display panel, a first adsorption layer is disposed on one of the first substrate and the second substrate, and a second adsorption layer is disposed on the other of the first substrate and the second substrate. The first adsorption layer and the second adsorption layer may be attracted to each other by magnetic force.

The first adsorption layer may be made from ferromagnetic material, and the second adsorption layer may include an electromagnet.

The first adsorption layer may be disposed on a side of the first substrate facing the second substrate, or disposed on a side of the second substrate facing the first substrate.

The first adsorption layer may include a portion disposed on the outer side of the sealant, and/or a portion disposed on the inner side of the sealant.

The first adsorption layer may be disposed in the vicinity of the sealant.

The first adsorption layer may at least partly overlap with an orthographic projection of the second adsorption layer onto the first substrate or the second substrate.

The electromagnet may include a plurality of independently controlled sub-electromagnets which may be disposed surrounding a display area of the display panel.

The plane in which the pattern formed by connecting magnetic poles of the plurality of sub-electromagnets in a sequential manner lies may be parallel to the plane in which the first adsorption layer lies.

The display panel may further comprise an isolation layer disposed between the electromagnet and one of the first substrate and the second substrate which is provided with the electromagnet, and the isolation layer is made from non-ferromagnetic material.

The electromagnet may be detachably disposed on the outer side of the first substrate or the second substrate.

The thickness of the first adsorption layer may be smaller than that of the melted sealant.

The display panel may be a light emitting diode display panel.

As a second aspect of the present invention, there is provided an encapsulation method of a display panel. The display panel comprises a first substrate and a second substrate which are disposed in opposition to each other. The encapsulation method comprises the following steps:

disposing a solid sealant on at least one of the first substrate and the second substrate;

disposing a first adsorption layer on one of the first substrate and the second substrate;

disposing a second adsorption layer on the other of the first substrate and the second substrate;

aligning the first substrate and the second substrate;

melting the sealant to connect the first substrate and the second substrate, wherein when the sealant is melted, the first adsorption layer and the second adsorption layer are attracted to each other by magnetic force; and solidifying the melted sealant.

The first adsorption layer may be made from ferromagnetic material, and the second adsorption layer may include an electromagnet. In the step of melting the sealant, power is supplied to the electromagnet such that the second adsorption layer generates magnetic force. In the step of solidifying the melted sealant, the power is stopped to be supplied to the electromagnet.

In the step of melting the sealant, a laser may be used to melt the sealant. The electromagnet includes a plurality of independently controlled sub-electromagnets which are disposed surrounding a display area. In the step of melting the sealant, the power is supplied to the sub-electromagnet corresponding to the region irradiated by the laser.

The strength of the electric signal applied to the sub-electromagnet may be increased as the intensity of the laser irradiating the region corresponding to the sub-electromagnet is increased; the strength of the electric signal applied to the sub-electromagnet may be decreased as the intensity of the laser irradiating the region corresponding to the sub-electromagnet is decreased.

The display panel may be a light emitting diode display panel.

Embodiments of the present invention can effectively avoid the separation of the first substrate and the second substrate due to the stress released during the process of melting the sealant, thereby improving the problem of poor encapsulation caused thereby.

BRIEF DESCRIPTION OF THE DRAWINGS

The drawings are used for providing further understanding of the present invention. They constitute a part of the specification and serve to explain the present invention in conjunction with the following detailed description, but should not be construed as limiting the present invention.

DETAILED DESCRIPTION

Figure 1:
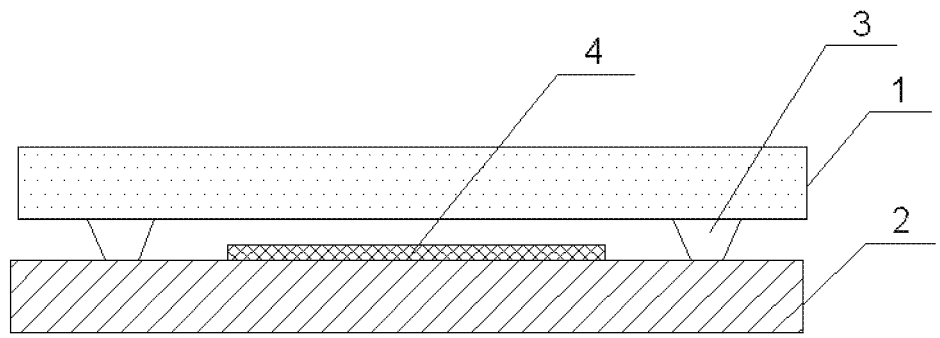
FIG. 1 is a schematic cross-sectional view of an existing LED display panel.

Hereinafter, embodiments of the present invention will be described in detail in conjunction with the drawings. It should be understood that embodiments described herein serve merely to describe and explain the present invention, but not to limit the present invention.

Embodiments of the present invention provide a display panel such as a LED display panel. In the following embodiment, the display panel will be described in detail by taking a LED display panel as an example. As shown in FIGS. 2 to 6, the LED display panel comprises a first substrate 1 and a second substrate 2 which are disposed in opposition to each other and are encapsulated by a sealant 3. In a non-display area of the LED display panel, a first adsorption layer 5 is disposed on one of the first substrate 1 and the second substrate 2, and a second adsorption layer 6 is disposed on the other of the first substrate 1 and the second substrate 2.

The first adsorption layer 5 and the second adsorption layer 6 may be attracted to each other by magnetic force.

The LED display panel herein may be an Organic Light Emitting Diode (OLED) display panel, or an Active Matrix Organic Light Emitting Diode (AMOLED) display panel. The first substrate 1 herein may be a cover plate, and the second substrate 2 may be a display substrate including a light emitting unit 4, and vice versa. If the second substrate 2 is a display substrate, the second substrate 2 may further have disposed thereon structures such as a thin film transistor device, a cathode, an anode and so on.

When manufacturing the LED display panel, it is required to form a solid sealant 3 on at least one of the first substrate 1 and the second substrate 2. After aligning the first substrate 1 and the second substrate 2, it is required to melt the sealant 3 to connect the first substrate 1 and the second substrate 2. After the first substrate 1 and the second substrate 2 are connected, the sealant 3 in melted state is solidified to encapsulate the first substrate 1 and the second substrate 2. Embodiments of the present invention improve the design of the first substrate 1 and the second substrate 2 in the LED display panel. During the process of melting the sealant 3, the first adsorption layer 5 and the second adsorption layer 6 are attracted to each other by magnetic force such that the first substrate 1 and the second substrate 2 are well pressed together. This avoids the separation of the first substrate 1 and the second substrate 2 due to the stress released during the process of melting the sealant 3, thereby improving the problem of poor encapsulation caused thereby.

Compared with the prior art, the advantages of the pressing manner by magnetic attraction lie in low cost, convenient operation and low tendency of causing damage to the display panel.

In embodiments of the present invention, there are no special limitations on the specific structures of the first adsorption layer 5 and the second adsorption layer 6. For example, each of the first adsorption layer 5 and the second adsorption layer 6 is a magnet capable of generating magnetic force, and the magnetic pole on a side of the first adsorption layer 5 facing the second adsorption layer 6 is contrary to the magnetic pole on a side of the second adsorption layer 6 facing the first adsorption layer 5, such that the first adsorption layer 5 and the second adsorption layer 6 may be attracted to each other. Alternatively, one of the first adsorption layer 5 and the second adsorption layer 6 is a magnet capable of generating magnetic force, and the other is made from ferromagnetic material capable of being attracted by magnetic force. The magnet may be either a permanent magnet or an electromagnet. In order to facilitate control and obtain a good display effect, it is preferable that the magnet is an electromagnet, and power is supplied to the electromagnet only when the sealant 3 is melted, and it is not required to supply power to the electromagnet in other phases.

As an example, the first adsorption layer 5 is made from ferromagnetic material, and the second adsorption layer 6 includes an electromagnet. The electromagnet can generate adsorption force to the first adsorption layer 5 made from ferromagnetic material, such that the first substrate 1 and the second substrate 2 are each completely bonded with the sealant 3 in melted state during the process of melting the sealant 3. That is, the first substrate 1 and the second substrate 2 can be always kept being connected.

Furthermore, the ferromagnetic material has good thermal conductivity, and thus may further serve as a heat-conducting layer to reduce the bad influence on the light emitting unit 4 due to the heat released when the sealant 3 is melted.

This improving effect is more notable especially when the light emitting unit 4 is an organic light emitting unit.

Those skilled in the art should understand that the ferromagnetic material in embodiments of the present invention refers to easily magnetizable substance such as iron (Fe), cobalt (Co), nickel (Ni) and so on.

Embodiments of the present invention have no limitations on the position at which the first adsorption layer 5 is disposed. However, the position of the first adsorption layer 5 should correspond to that of the second adsorption layer 6. The first adsorption layer 5 may be disposed for example on a side of the first substrate 1 away from the second substrate 2 (i.e., on the outer side of the first substrate 1), or may be disposed on a side of the second substrate 2 away from the first substrate 1 (i.e., on the outer side of the second substrate 2). Preferably, the first adsorption layer 5 is located between the first substrate 1 and the second substrate 2. This includes the case where the first adsorption layer 5 is disposed on the first substrate 1 (i.e., the first adsorption layer 5 is disposed on a side of the first substrate 1 facing the second substrate 2), and the case where the first adsorption layer 5 is disposed on the second substrate 2 (i.e., the first adsorption layer 5 is disposed on a side of the second substrate 2 facing the first substrate 1), which will be described below specifically. Compared with the case where the first adsorption layer 5 is disposed on the outer side of the first substrate 1 or the second substrate 2, the case where the first adsorption layer 5 is disposed between the first substrate 1 and the second substrate 2 can reduce the distance between the first adsorption layer 5 and the second adsorption layer 6, such that the adsorption force generated between the first adsorption layer 5 and the second adsorption layer 6 can act better on the first substrate 1 and the second substrate 2 to press the two substrates tightly, which is beneficial to enhance the encapsulation effect.

In embodiments of the present invention, the sealant 3 forms a closed path between the first substrate 1 and the second substrate 2 (the region enclosed by the closed path is sufficient to accommodate the light emitting unit 4) to encapsulate them as a display panel. The first adsorption layer 5 includes a portion disposed on the outer side of the sealant 3, and/or a portion disposed on the inner side of the sealant 3. The outer side of the sealant 3 refers to the outer periphery of the closed path, and the inner side of the sealant 3 refers to the inner periphery of the closed path. Preferably, the first adsorption layer 5 is disposed in the vicinity of the sealant 3. Further, the first adsorption layer 5 overlaps at least partly with an orthographic projection of the second adsorption layer 6 onto the first substrate 1 or the second substrate 2, such that the position of the first adsorption layer 5 corresponds to that of the second adsorption layer 6.

The first adsorption layer 5 is made from ferromagnetic material, and the second adsorption layer 6 includes an electromagnet. As a consequence, by disposing the first adsorption layer 5 in the vicinity of the sealant 3 (on the outer side and/or the inner side) and letting the positions of the first adsorption layer 5 and the second adsorption layer 6 correspond to each other, the adsorption force applied by the electromagnet to the ferromagnetic material can to the greatest extent act on the region in which the sealant 3 lies. Thereby, the first substrate 1 and the second substrate 2 are pressed tightly when the sealant 3 is melted, avoiding poor encapsulation results such as separation of the two substrates due to the stress released between the two substrates.

Hereinafter, description will be made by taking each of the structures shown in FIGS. 2 and 5 as an example.

Figure 2:
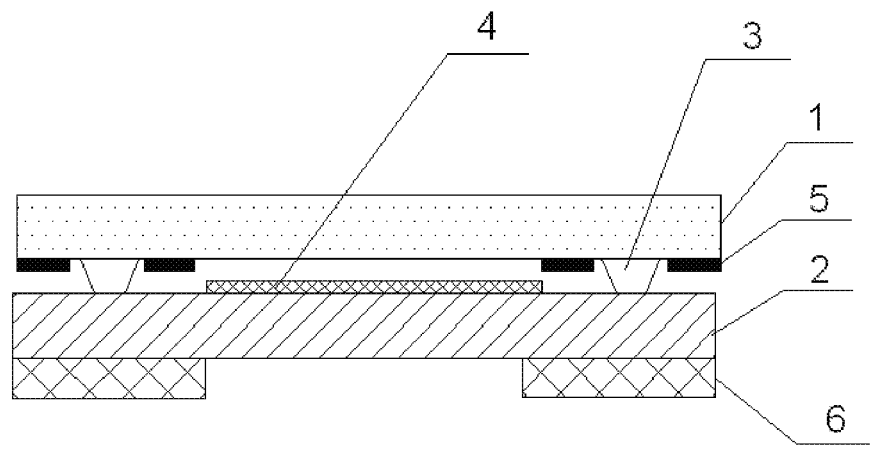
FIG. 2 is a schematic cross-sectional view of a LED display panel according to an embodiment of the present invention.

FIG. 2 shows the case where the first adsorption layer 5 is disposed on the first substrate 1 (i.e., the first adsorption layer 5 is disposed on a side of the first substrate 1 facing the second substrate 2). In FIG. 2, the sealant 3 may be formed on the first substrate 1 in a manner such as screen printing. The light emitting unit 4 may be formed on the second substrate 2 in a manner such as vacuum evaporation, inkjet printing and spin coating, and the light emitting unit 4 may be an organic light emitting unit. The first adsorption layer 5 may be formed on the first substrate 1 in a manner such as sputtering or vacuum evaporation by using ferromagnetic material such as iron (Fe), cobalt (Co), nickel (Ni) or an alloy thereof. The second adsorption layer 6 includes an electromagnet, and is disposed on the outer side of the second substrate 2 (i.e., on a side of the second substrate 2 away from the first substrate 1) in a manner such as pasting. The magnitude of the magnetic property of the electromagnet is controlled by an external power supply.

Figure 4:
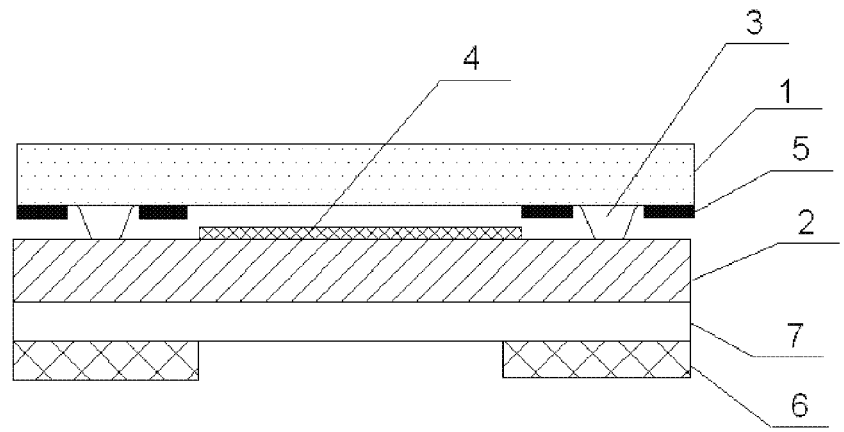
FIG. 4 is a schematic cross-sectional view of a LED display panel according to an embodiment of the present invention.

In order to prevent contamination from being caused by directly attaching the electromagnet contained in the second adsorption layer 6 onto the second substrate 2, the LED display panel further comprises an isolation layer 7 disposed between the electromagnet (contained in the second adsorption layer 6) and the second substrate 2, as shown in FIG. 4.

Figure 5:
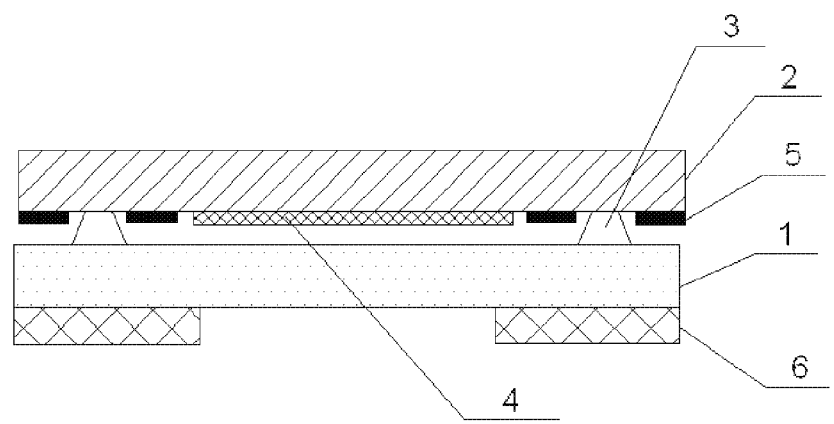
FIG. 5 is a schematic cross-sectional view of a LED display panel according to an embodiment of the present invention.

FIG. 5 shows the case where the first adsorption layer 5 is disposed on the second substrate 2 (i.e., the adsorption layer 5 is disposed on a side of the second substrate 2 facing the first substrate 1). In FIG. 5, the sealant 3 may be formed on the first substrate 1 in a manner such as screen printing. The light emitting unit 4 may be formed on the second substrate 2 in a manner such as vacuum evaporation, inkjet printing, and spin coating, and the light emitting unit 4 may be an organic light emitting unit. The first adsorption layer 5 may be formed on the second substrate 2 in a manner such as sputtering or vacuum evaporation by using ferromagnetic materials such as iron (Fe), cobalt (Co), nickel (Ni) or an alloy thereof. The second adsorption layer 6 includes an electromagnet, and is disposed on the outer side of the first substrate 1 (i.e., on a side of the first substrate 1 away from the second substrate 2) in a manner such as pasting. The magnitude of the magnetic property of the electromagnet is controlled by an external power supply.

Figure 6:
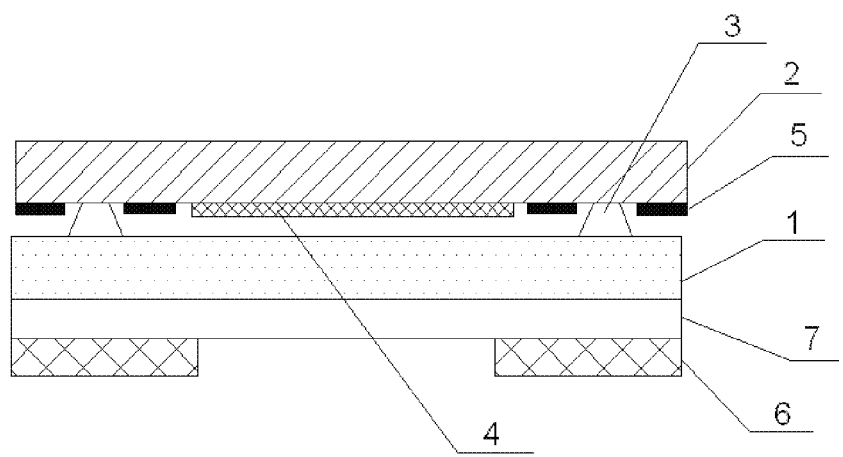
FIG. 6 is a schematic cross-sectional view of a LED display panel according to an embodiment of the present invention.

Likewise, in order to prevent contamination from being caused by directly attaching the electromagnet contained in the second adsorption layer 6 onto the first substrate 1, the LED display panel further comprises an isolation layer 7 disposed between the electromagnet (contained in the second adsorption layer 6) and the first substrate 1, as shown in FIG. 6.

The isolation layer 7 in embodiments of the present invention is made from non-ferromagnetic material. The non-ferromagnetic material refers to material which cannot generate magnetic property under the action of magnetic field. Thus, the isolation layer 7 has no influence on the magnetic field of the electromagnet.

Figure 3:
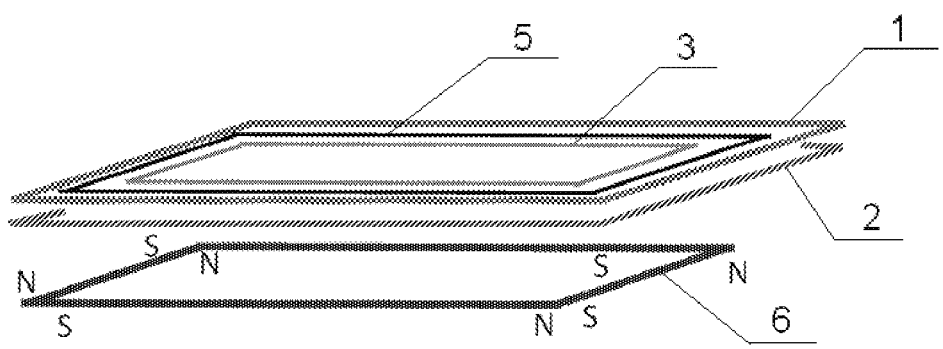
FIG. 3 is a schematic perspective view of a LED display panel according to an embodiment of the present invention.

FIG. 3 is a schematic perspective view of a LED display panel according to an embodiment of the present invention. In FIG. 3, the first adsorption layer 5 is disposed on the outer side of the sealant 3. The electromagnet contained in the second adsorption layer 6 includes a plurality of independently controlled sub-electromagnets which are disposed surrounding a display area of the LED display panel. In FIG. 3, for example, magnetic poles of the plurality of sub-electromagnets are connected in a sequential manner (i.e., an N pole is connected with an S pole). Specifically, the N pole of each sub-electromagnet is connected with the S pole of the adjacent sub-electromagnet, and the S pole of each sub-electromagnet is connected with the N pole of the adjacent sub-electromagnet.

Preferably, the plane in which the pattern formed by connecting the magnetic poles of the plurality of sub-electromagnets in a sequential manner lies is parallel to the plane in which the first adsorption layer 5 lies, so as to facilitate the manufacture and enable the first substrate 1 and the second substrate 2 to receive more uniform pressure.

In embodiments of the present invention, the electromagnet is detachably disposed on the outer side of the first substrate 1 or the second substrate 2 (i.e., on a side of the first substrate 1 away from the second substrate 2, or on a side of the second substrate 2 away from the first substrate 1). After the first substrate 1 and the second substrate 2 have been encapsulated, the electromagnet may be detached so as to facilitate the lightweight and miniature realization of the LED display panel.

When the first adsorption layer 5 is located between the first substrate 1 and the second substrate 2, the thickness of the first adsorption layer 5 should be smaller than the thickness of the melted sealant 3, thereby ensuring the complete contact between each of the first substrate 1 and the second substrate 2 and the sealant 3 in melted state. In order to facilitate the production, the thickness of the first adsorption layer 5 is preferably larger than 5 nm.

As described above, the sealant 3 is melted by means of laser irradiation, so as to connect the first substrate 1 and the second substrate 2 together and realize the encapsulation of the LED display panel. In embodiments of the present invention, the electric signal applied on the electromagnet may be synchronized with the laser signal for irradiating the sealant 3. That is, as the scan region and light intensity of the laser on the sealant 3 are changed, the range and strength of the magnetic field generated by the electromagnet are adjusted so as to timely adjust the pressure applied on the melted region of the sealant 3 as well as the portions of the first substrate 1 and the second substrate 2 near the melted region, thereby reducing poor encapsulation results due to the stress released between the first substrate 1 and the second substrate 2.

Compared with the prior art in which the laser can only irradiate from the bottom up, embodiments of the present invention enable the laser to irradiate from a plurality of directions and in a plurality of angles, and are very convenient for operation.

Besides, embodiments of the present invention can precisely control the region of the applied magnetic field as well as the magnitude of the magnetic force. For example, in FIG. 3, the electromagnet consists of four sub-electromagnets whose N poles and S poles are head-tail connected. When the laser is irradiating while moving along the sealant 3, only the sub-electromagnet corresponding to the region being irradiated by the laser may be selected to be supplied with power, and the strength of the electric signal may be adjusted according to the current light intensity of the laser, such that the LED display panel can be encapsulated evenly in respective regions thereof.

Embodiments of the present invention further provide an encapsulation method of a display panel which may be for example a LED display panel. In the following embodiment, the encapsulation method of the display panel will be described in detail by taking a LED display panel as an example. The LED display panel comprises a first substrate and a second substrate which are disposed in opposition to each other.

The encapsulation method comprises the following steps:

disposing a solid sealant on at least one of the first substrate and the second substrate;

disposing a first adsorption layer on one of the first substrate and the second substrate;

disposing a second adsorption layer on the other of the first substrate and the second substrate;

aligning the first substrate and the second substrate;

melting the sealant to connect the first substrate and the second substrate, wherein when the sealant is melted, the first adsorption layer and the second adsorption layer are attracted to each other by magnetic force; and solidifying the melted sealant.

Further, the first adsorption layer is made from ferromagnetic material, and the second adsorption layer includes an electromagnet. In the step of melting the sealant, power is supplied to the electromagnet such that the second adsorption layer generates magnetic force, thereby generating adsorption force to the first adsorption layer made from ferromagnetic material and thus enabling each of the first substrate 1 and the second substrate 2 to be completely bonded with the sealant in melted state. In the step of solidifying the melted sealant, the power is stopped to be supplied to the electromagnet.

Further, in the step of melting the sealant, a laser is used to melt the sealant. The electromagnet includes a plurality of independently controlled sub-electromagnets which are disposed surrounding a display area of the LED display panel. In the step of melting the sealant, power is supplied to the sub-electromagnet corresponding to the region being irradiated by the laser.

Further, the strength of the electric signal applied to the sub-electromagnet is increased as the intensity of the laser irradiating the region corresponding to the sub-electromagnet is increased; and the strength of the electric signal applied to the sub-electromagnet is decreased as the intensity of the laser irradiating the region corresponding to the sub-electromagnet is decreased.

Embodiments of the present invention can effectively avoid the separation of the first substrate and the second substrate due to the stress released during the process of melting the sealant, thereby improving the problem of poor encapsulation caused thereby. Besides, the first adsorption layer made from ferromagnetic material has good thermal conductivity, and thus may further serve as a heat-conducting layer to reduce the bad influence on the light emitting unit due to the heat released when the sealant is melted.

Hereinafter, the encapsulation method according to an embodiment of the present invention will be described in detail in conjunction with the structures shown in FIGS. 2 and 5.

As for the structure shown in FIG. 2, the encapsulation method may comprise the following steps:

the manufacture of the second substrate 2 and the light emitting unit 4 thereon is completed by means of conventional thin film transistor manufacturing process and evaporation process for a light emitting unit, respectively;

the manufacture of the sealant 3 is completed on the first substrate 1 in a manner such as screen printing and spraying, and the sealant 3 is molded by means of baking process;

the manufacture of the first adsorption layer 5 is completed on the first substrate 1 by means of processes such as vacuum filming and photoetching, the first adsorption layer 5 being made from ferromagnetic material, wherein the thickness of the first adsorption layer 5 is preferably larger than 5 nm and smaller than the thickness of the melted sealant 3;

the second adsorption layer 6 is disposed on the second substrate 2, wherein the second adsorption layer 6 includes an electromagnet;

the first substrate 1 and the second substrate 2 are aligned in such a state that the sealant 3, the light emitting unit 4 and the first adsorption layer 5 are located between the first substrate 1 and the second substrate 2, and the second adsorption layer 6 is located on a side of the second substrate 2 away from the first substrate 1; the sealant 3 is melted by means of laser irradiation so as to connect the first substrate 1 and the second substrate 2 together; at the same time, a voltage is applied to the electromagnet contained in the second adsorption layer 6 such that the electromagnet generates magnetic property so as to attract the first adsorption layer 5 made from ferromagnetic material and thus to press well the first substrate 1 and the second substrate 2 together;

furthermore, the voltage signal applied on the electromagnet may be synchronized with the laser signal; in the case where the stress between the first substrate 1 and second substrate 2 changes, the attracting range and magnitude of the magnetic field of the electromagnet are timely adjusted, and thus the pressure applied on the melted region of the sealant 3 as well as the portions of the first substrate 1 and the second substrate 2 near the melted region is timely adjusted;

after the sealant 3 is melted and the encapsulation of the first substrate 1 and second substrate 2 is completed, the voltage signal applied on the electromagnet is turned off to complete the encapsulation process.

As for the structure shown in FIG. 5, the encapsulation method may comprise the following steps:

the manufacture of the second substrate 2 and the light emitting unit 4 thereon is completed by means of conventional thin film transistor manufacturing process and evaporation process for a light emitting unit, respectively;

the manufacture of the sealant 3 is completed on the first substrate 1 in a manner such as screen printing and spraying, and the sealant 3 is molded by means of baking process;

the manufacture of the first adsorption layer 5 is completed on the second substrate 2 by means of processes such as vacuum filming and photoetching, the first adsorption layer 5 being made from ferromagnetic material, wherein the thickness of the first adsorption layer 5 is preferably larger than 5 nm and smaller than the thickness of the melted sealant 3;

the second adsorption layer 6 is disposed on the first substrate 1, wherein the second adsorption layer 6 includes an electromagnet;

the first substrate 1 and the second substrate 2 are aligned in such a state that the sealant 3, the light emitting unit 4 and the first adsorption layer 5 are located between the first substrate 1 and the second substrate 2, and the second adsorption layer 6 is located on a side of the first substrate 1 away from the second substrate 2; the sealant 3 is melted by means of laser irradiation so as to connect the first substrate 1 and the second substrate 2 together; at the same time, a voltage is applied to the electromagnet contained in the second adsorption layer 6 such that the electromagnet generates magnetic property so as to attract the first adsorption layer 5 made from ferromagnetic material and thus to press well the first substrate 1 and the second substrate 2 together;

furthermore, the voltage signal applied on the electromagnet may be synchronized with the laser signal; in the case where the stress between the first substrate 1 and second substrate 2 changes, the attracting range and magnitude of the magnetic field of the electromagnet are timely adjusted, and thus the pressure applied on the melted region of the sealant 3 as well as the portions of the first substrate 1 and the second substrate 2 near the melted region is timely adjusted;

after the sealant 3 is melted and the encapsulation of the first substrate 1 and second substrate 2 is completed, the voltage signal applied on the electromagnet is turned off to complete the encapsulation process.

Any existing frit may be used as the sealant mentioned in embodiments of the present invention.

Embodiments of the present invention effectively avoid the separation of the first substrate 1 and the second substrate 2 due to the stress released during the process of melting the sealant 3, thereby improving the problem of poor encapsulation caused thereby. Besides, the second adsorption layer made from ferromagnetic material has good thermal conductivity, and thus may further serve as a heat-conducting layer to reduce the bad influence on the light emitting unit 4 due to the heat released when the sealant 3 is melted.

It should be understood that the above embodiments are merely exemplary embodiments employed to explain the principles of the present invention. However, the present invention is not limited thereto. Those skilled in the art may make various variations and improvements without departing from the spirit and essence of the present invention, and such variations and improvements should be considered as falling into the protection scope of the present invention.

The invention claimed is:

1. A display panel comprising a first substrate and a second substrate which are disposed in opposition to each other, the first substrate and the second substrate encapsulated by a sealant, wherein in a non-display area of the display panel, a first attraction layer is disposed on one of the first substrate and the second substrate, and a second attraction layer is disposed on the other of the first substrate and the second substrate, and the first attraction layer and the second attraction layer are attracted to each other by magnetic force, the first attraction layer disposed on a side of the first substrate facing the second substrate or disposed on a side of the second substrate facing the first substrate.

2. The display panel according to claim 1, wherein the first attraction layer is made from ferromagnetic material, and the second attraction layer includes an electromagnet.

3. The display panel according to claim 2, wherein the first attraction layer includes a portion disposed on an outer side of the sealant and/or a portion disposed on an inner side of the sealant.

4. The display panel according to claim 3, wherein the first attraction layer is disposed in a vicinity of the sealant.

5. The display panel according to claim 1, wherein the first attraction layer overlaps at least partly with an orthographic projection of the second attraction layer onto the first substrate or the second substrate.

6. The display panel according to claim 2, wherein the electromagnet includes a plurality of independently controlled sub-electromagnets which are disposed surrounding a display area of the display panel.

7. The display panel according to claim 6, wherein a plane in which a pattern formed by connecting magnetic poles of the plurality of sub-electromagnets in a sequential manner lies is parallel to a plane in which the first attraction layer lies.

8. The display panel according to claim 2, wherein the display panel further comprises an isolation layer disposed between the electromagnet and the one of the first substrate and the second substrate which is provided with the electromagnet, and the isolation layer is made from non-ferromagnetic material.

9. The display panel according to claim 2, wherein the electromagnet is detachably disposed on the outer side of the first substrate or the second substrate.

10. The display panel according to claim 2, wherein a thickness of the first attraction layer is smaller than that of the melted sealant.

11. The display panel according to claim 1, wherein the display panel is a light emitting diode display panel.

12. An encapsulation method of a display panel comprising a first substrate and a second substrate which are disposed in opposition to each other, the encapsulation method comprising:
   disposing a solid sealant on at least one of the first substrate and the second substrate;
   disposing a first attraction layer on one of the first substrate and the second substrate, the first attraction layer disposed on a side of the first substrate facing the second substrate or disposed on a side of the second substrate facing the first substrate;
   disposing a second attraction layer on the other of the first substrate and the second substrate;
   aligning the first substrate and the second substrate;
   melting the sealant to connect the first substrate and the second substrate, wherein when the sealant is melted, the first attraction layer and the second attraction layer are attracted to each other by magnetic force; and
   solidifying the melted sealant.

13. The encapsulation method according to claim 12, wherein:
   the first attraction layer is made from ferromagnetic material, and the second attraction layer includes an electromagnet;
   when melting the sealant, power is supplied to the electromagnet such that the second attraction layer generates magnetic force; and
   when solidifying the melted sealant, the power supplied to the electromagnet is stopped.

14. The encapsulation method according to claim 13, wherein:
   when melting the sealant, a laser is used to melt the sealant;
   the electromagnet includes a plurality of independently controlled sub-electromagnets which are disposed surrounding a display area of the display panel; and
   when melting the sealant, power is supplied to the sub-electromagnet corresponding to a region being irradiated by the laser.

15. The encapsulation method according to claim 14, wherein:
   a strength of an electric signal applied to the sub-electromagnet is increased as an intensity of the laser irradiating the region corresponding to the sub-electromagnet is increased; and
   the strength of the electric signal applied to the sub-electromagnet is decreased as the intensity of the laser irradiating the region corresponding to the sub-electromagnet is decreased.

16. The encapsulation method according to claim 12, wherein the display panel is a light emitting diode display panel.

* * * * *